United States Patent
Chang et al.

[19]

[11] Patent Number: 5,858,619
[45] Date of Patent: Jan. 12, 1999

[54] MULTI-LEVEL CONDUCTIVE MATRIX FORMATION METHOD

[75] Inventors: David C. Chang, San Jose; Arthur J. Learn, Cupertino; Bob L. Mackey, San Jose; Paul M. Drumm, San Jose; David L. Morris, San Jose, all of Calif.

[73] Assignee: Candescent Technologies Corporation, San Jose, Calif.

[21] Appl. No.: 940,819

[22] Filed: Sep. 30, 1997

[51] Int. Cl.$^6$ .................................. G03F 7/00; B05D 5/12
[52] U.S. Cl. .......................... 430/312; 430/315; 430/321; 430/25; 445/24; 427/68
[58] Field of Search .............................. 430/25, 312, 315, 430/321; 445/24; 427/68

[56] References Cited

U.S. PATENT DOCUMENTS

| | | | |
|---|---|---|---|
| 3,779,760 | 12/1973 | Miyuaka | 430/25 |
| 5,543,683 | 8/1996 | Haven et al. | 313/461 |
| 5,670,296 | 9/1997 | Tsai | 430/312 |

*Primary Examiner*—John A. McPherson
*Attorney, Agent, or Firm*—Wagner, Murabito & Hao

[57] ABSTRACT

A method for forming a three-dimensional multi-level conductive matrix structure for a flat panel display device. In one embodiment, the present invention forms first pixel separating structures across a surface of a faceplate of a flat panel display. The first pixel separating structures separate adjacent first sub-pixel regions. In this embodiment, the first pixel separating structures are formed by applying a first layer of photo-imagable material across the surface of the faceplate. Next, portions of the first layer of photo-imagable material are removed to leave regions of the first layer of photo-imagable material covering respective first sub-pixel regions. Then, a first layer of conductive material is applied over the surface of the faceplate such that the first layer conductive material is disposed between the aforementioned regions of the first layer of photo-imagable material. The present invention then removes the regions of the first layer of photo-imagable material leaving only first pixel separating structures formed of the first layer of conductive material, disposed between the first sub-pixel regions. The present invention performs similar steps in order to form second pixel separating structures between the second sub-pixel regions. The second pixel separating structures are formed substantially orthogonally oriented with respect to the first pixel separating structures and, in the present embodiment, have a different height than the first pixel separating structures. In so doing, a three-dimensional multi-level conductive matrix structure is formed.

39 Claims, 13 Drawing Sheets

MULTI-LEVEL CONDUCTIVE MATRIX FORMATION METHOD

FIELD OF THE INVENTION

The present claimed invention relates to the field of flat panel displays. More particularly, the present claimed invention relates to the "black matrix" of a flat panel display screen structure.

BACKGROUND ART

Sub-pixel regions on the faceplate of a flat panel display are typically separated by an opaque mesh-like structure commonly referred to as a "black matrix". By separating sub-pixel regions, the black matrix prevents electrons directed at one sub-pixel from being "back-scattered" and striking another sub-pixel. In so doing, a conventional black matrix helps maintain sharp resolution in a flat panel display. In addition, the black matrix is also used as a base on which to locate structures such as, for example, support walls.

In one prior art black matrix, a very thin layer (e.g. approximately 2–3 microns) of a conductive material is applied to the interior surface of the faceplate surrounding the sub-pixel regions. Typically, the conductive black matrix is formed of a conductive graphite material. By having a conductive black matrix, excess charges induced by electrons striking the top or sides of the black matrix can be easily drained from the interior surface of the faceplate. As an additional benefit, a conductive black matrix allows one to control the electric potential on the faceplate. Additionally, in a field emission-type flat panel display, by having a conductive black matrix, electrical arcs occurring between field emitters of the flat panel display and the faceplate will be more likely to strike the black matrix. By having the electrical arcing occur between the black matrix and the field emitters instead of between the sub-pixels and the field emitters, the integrity of the phosphors and the overlying aluminum layer is maintained. Unfortunately, due to the relatively low height of such a prior art conductive black matrix, arcing can still occur from the field emitter to the sub-pixel regions. As a result of such arcing, phosphors and the overlying aluminum layer can be damaged. As mentioned above, however, the black matrix is also intended to prevent back-scattering of electrons from one sub-pixel to another sub-pixel. Thus, it is desirable to have a black matrix with a height which sufficiently isolates each sub-pixel from respective neighboring sub-pixels. However, due to the physical property of the conductive graphite material, the height of the black matrix is limited to the aforementioned 2–3 microns.

In another prior art black matrix, a non-conductive polyimide material is patterned across the interior surface of the black matrix. In such a conventional black matrix, the black matrix has a uniform height of approximately 20–40 microns. Thus, the height of such a black matrix is well suited to isolating each sub-pixel from respective neighboring sub-pixels. As a result, such a black matrix configuration effectively prevents unwanted back-scattering of electrons into neighboring sub-pixels. Unfortunately, prior art polyimide black matrices are not conductive. As a result, even though the top edge of the polyimide black matrix is much closer than the sub-pixel region is to the field emitter, unwanted arcing can still occur from the field emitter to the sub-pixel regions. In a prior art attempt to prevent such arcing, a conductive coating (i.e. indium tin oxide (ITO)) is applied to the non-conductive polyimide black matrix. ITO coated non-conductive black matrices are not without problems, however. For example, coating a non-conductive matrix with ITO adds increased complexity and cost to the flat panel display manufacturing process. Also, the high atomic number of ITO components results in unwanted back-scattering of electrons. Furthermore, ITO has an undesirably high secondary electron emission coefficient, δ.

In yet another approach, (described in a commonly-owned, co-pending U.S. patent application to Drumm, filed Mar. 31, 1997), capillary action is used to define the shape of a black matrix structure. In such an approach, rows and columns of photoresist structures are formed on the surface of the faceplate of the flat panel display device. The photoresist structures are formed on the faceplate directly overlying the areas which are to be used as sub-pixel regions. Conductive material is then applied between the photoresist structures, and is slightly hardened. In this approach, physical properties of the conductive material (e.g. viscosity, surface tension, density, and the like) determine the height and shape of the black matrix structure formed between the rows and columns of the photoresist structures. However, the physical properties of the conductive material may not allow for, or may prevent, the formation of a black matrix structure having particular physical dimensions.

Thus, a need exists for conductive matrix structure having sufficient height to effectively separate neighboring sub-pixels. A further need exists for a conductive matrix structure which reduces arcing from the field emitters to the sub-pixels. Still another need exists for a conductive matrix structure which does not have the increased cost and complexity, the increased back-scattering rate, and the undesirably high secondary electron emission coefficient associated with an ITO-coated black matrix structure. Yet another need exists for a conductive matrix formation method which is not highly dependent upon the physical properties of the material used to form the matrix structure.

SUMMARY OF INVENTION

The present invention provides a conductive matrix structure having sufficient height to effectively separate neighboring sub-pixels. The present invention further provides a conductive matrix structure which reduces arcing from the field emitters to the sub-pixels. The present invention also provides a conductive matrix structure which does not have the increased cost and complexity, the increased back-scattering rate, and the undesirably high secondary electron emission coefficient associated with an ITO-coated black matrix structure. Furthermore, the present invention provides a conductive matrix formation method which is not highly dependent upon the physical properties of the material used to form the matrix structure. Also, it will be understood that the conductive matrix structure of the present invention is applicable in numerous types of flat panel displays.

Specifically, in one embodiment, the present invention forms first pixel separating structures across a surface of a faceplate of a flat panel display. The first pixel separating structures separate adjacent first sub-pixel regions. In this embodiment, the first pixel separating structures are formed by applying a first layer of photo-imagable material across the surface of the faceplate. Next, portions of the first layer of photo-imagable material are removed to leave regions of the first layer of photo-imagable material covering respective first sub-pixel regions. Then, a first layer of conductive material is applied over the surface of the faceplate such that the first layer conductive material is disposed between the aforementioned regions of the first layer of photo-imagable material. The present invention then removes the regions of the first layer of photo-imagable material leaving only first pixel separating structures formed of the first layer of conductive material, disposed between the first sub-pixel regions. The present invention performs similar steps in order to form second pixel separating structures between the second sub-pixel regions. The second pixel separating structures are formed substantially orthogonally oriented with respect to the first pixel separating structures and, in the present embodiment, have a different height than the first pixel separating structures. In so doing, a three-dimensional multi-level conductive matrix structure is formed.

In yet another embodiment, the present invention deposits a first pixel separating structure onto a surface of a faceplate of a flat panel display device. The first pixel separating structure is disposed on the surface of the faceplate such that the first pixel separating structure separates first sub-pixel regions. In this embodiment, the first pixel separating structure is formed by repeatedly applying layers of conductive material over the surface of the faceplate until the first pixel separating structure is formed having a desired height between the first sub-pixel regions. Next, the present invention deposits a second pixel separating structure onto the surface of the faceplate. In the present embodiment, the second pixel separating structure is formed by repeatedly applying layers of conductive material over the surface of the faceplate until the second pixel separating structure is formed having a desired height between the second sub-pixel regions. The second pixel separating structure is disposed on the surface of the faceplate such that the second pixel separating structure is orthogonally oriented with respect to the first pixel separating structure.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail so as not to unnecessarily obscure aspects of the present invention.

Figure 1:
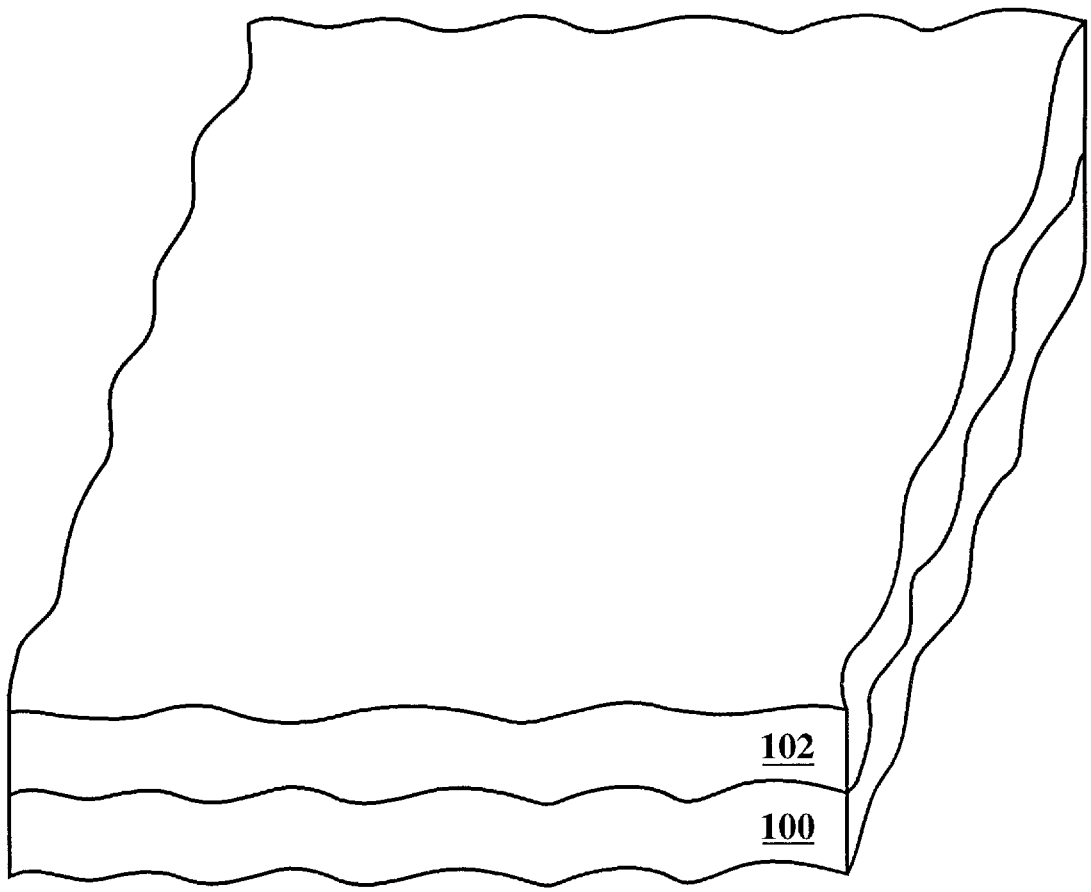
FIG. 1 is a perspective view of a faceplate of a flat panel display device having a first layer of photo-imagable material deposited thereon in accordance with the present claimed invention.

With reference now to FIG. 1, a first step used by the present embodiment in the formation of a multi-level conductive black matrix structure is shown. More specifically, FIG. 1 shows a perspective view of a faceplate 100 of a flat panel display device having a first layer of photo-imagable material 102 deposited thereon in accordance with the present claimed invention. Although the matrix structure of the present invention is sometimes referred to as a black matrix, it will be understood that the term "black" refers to the opaque characteristic of the matrix structure. That is, the present invention is also well suited to having a color other than black. Furthermore, in the following Figures, only a portion of the interior surface of a faceplate is shown for purposes of clarity.

Referring still to FIG. 1, in the present embodiment, layer 102 of photo-imagable material is comprised of photoresist such as, for example, AZ4620 Photoresist, available from Hoechst-Celanese of Somerville, N.J. It will be understood, however, that the present invention is well suited to the use of various other types and suppliers of photo-imagable material. Layer of photoresist 102 is deposited to a depth of approximately 10–20 microns in the present embodiment.

Figure 2:
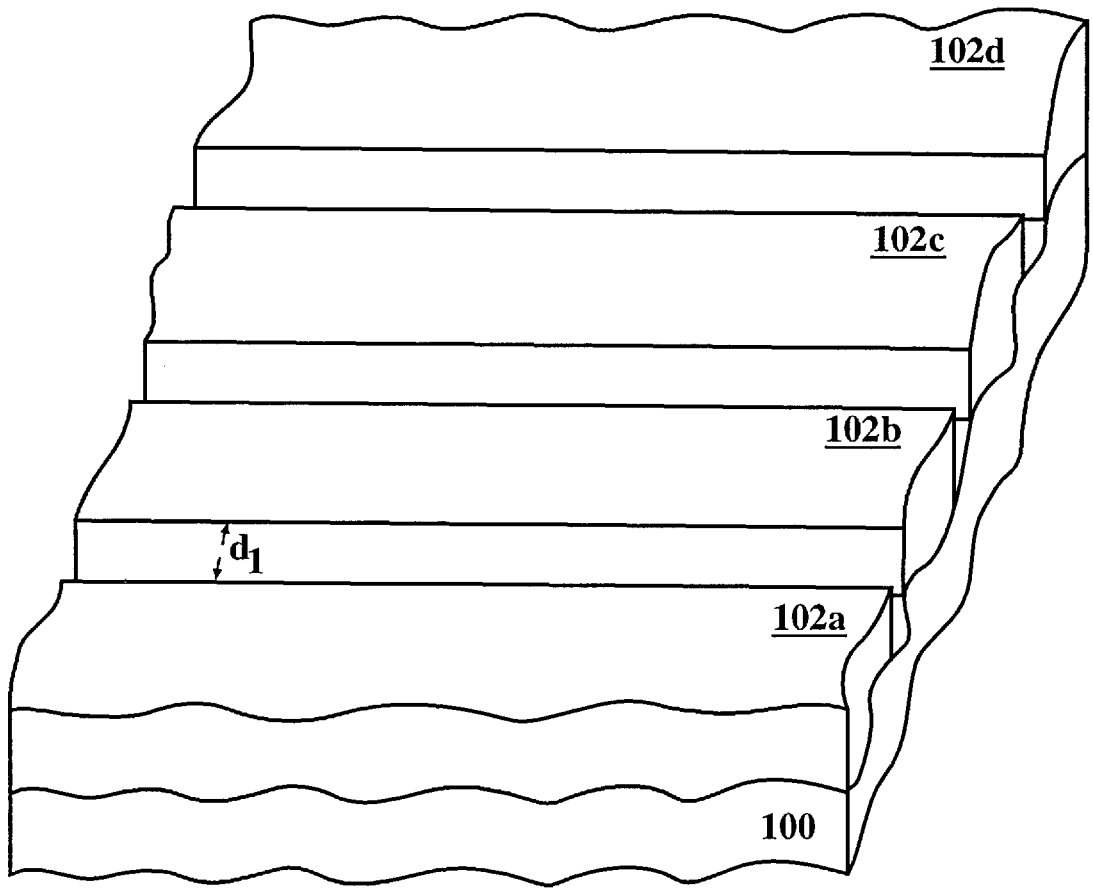
FIG. 2 is a perspective view of the structure of FIG. 1 after patterning of the first layer of photo-imagable material in accordance with the present claimed invention.

With reference next to FIG. 2, after the deposition of layer of photo-imagable material 102, layer of photo-imagable material 102 is subjected to an exposure process. After the exposure process, the present embodiment removes portions of layer of photo-imagable material 102, such that only hardened rows of photoresist structures 102a, 102b, 102c, and 102d remain on faceplate 100. Rows 102a, 102b, 102c, and 102d of photo-imagable material are disposed covering respective rows of sub-pixel regions. Although only four rows 102a, 102b, 102c, and 102d are shown in FIG. 1 for purposes of clarity, it will be understood that numerous rows of photoresist structures will be formed on the interior surface of a faceplate. In this embodiment, adjacent rows such as, for example, rows 102a and 102b of photoresist structures 100 are separated from each other by a distance, $d_1$, where $d_1$ is the separation distance between adjacent rows of sub-pixel regions. More specifically, in the present embodiment, adjacent rows 102a and 102b of photo-imagable material are separated by a distance of approximately 65–80 microns. Although such row separation distances are specified in the present embodiment, the present invention is also well suited to separating adjacent rows by various other distances.

Figure 3:
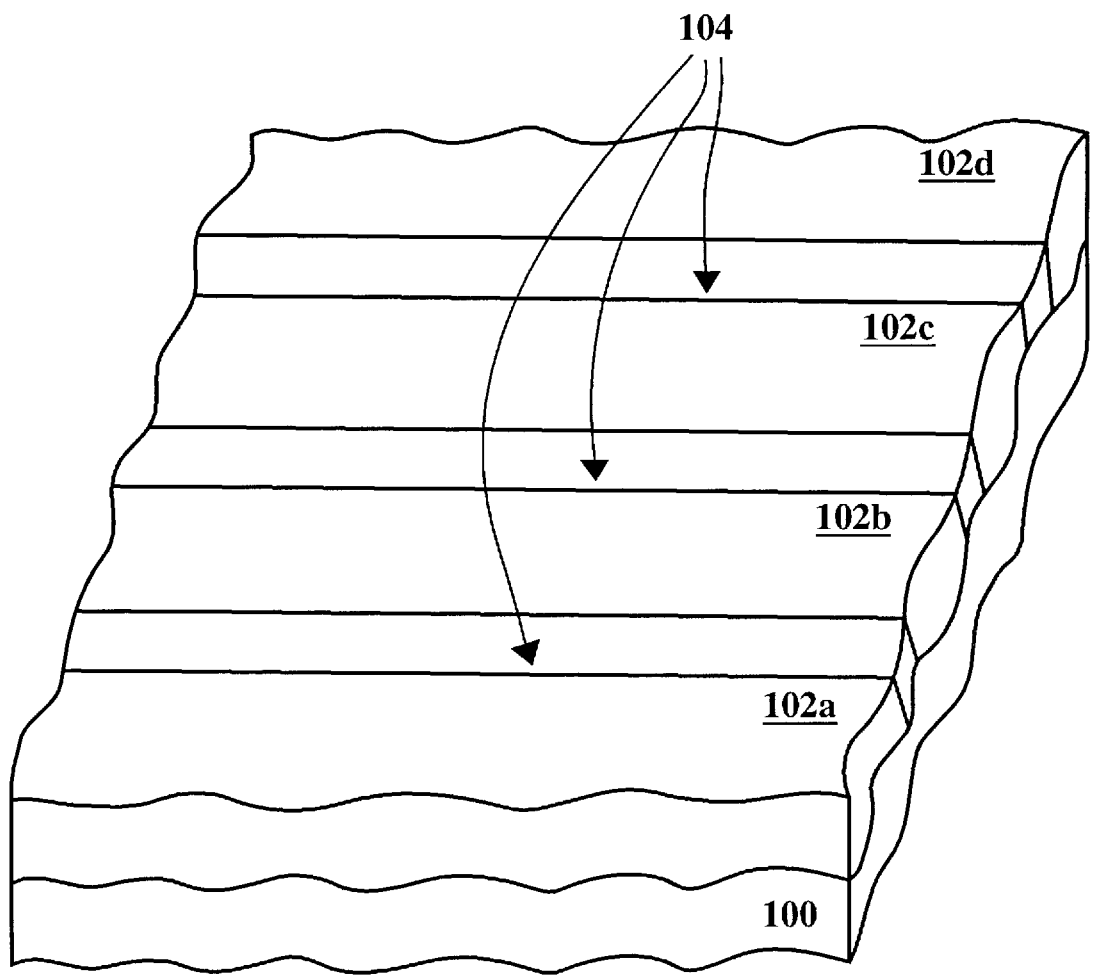
FIG. 3 is a perspective view of the structure of FIG. 2 having a first layer of conductive material disposed thereon in accordance with the present claimed invention.

Referring now to FIG. 3, the present embodiment then applies a layer of conductive material 104 over the rows of photo-imagable material 102a, 102b, 102c, and 102d. More specifically, in one embodiment, the layer of conductive material 104 is applied over the interior surface of faceplate 100 and rows of photo-imagable material 102a, 102b, 102c, and 102d such that the conductive material is disposed over and between rows of photo-imagable material 102a, 102b, 102c, and 102d. In the present embodiment, layer of conductive material 104 is comprised, for example, of a CB800A DAG made by Acheson Colloids of Port Huron, Mich. In one embodiment, layer of conductive material 104 is comprised of a graphite-based conductive material. In still another embodiment, the layer of graphite-based conductive material is applied as a semi-dry spray to reduce shrinkage of layer of conductive material 104. In so doing, the present invention allows for improved control over the final depth of layer of conductive material. Although such deposition methods are recited above, it will be understood that the present invention is also well suited to using various other deposition methods to deposit various other conductive materials over the interior surface of faceplate 100 and between rows of photo-imagable material 102a, 102b, 102c, and 102d.

With reference still to FIG. 3, in one embodiment, excess conductive material disposed on top of and/or between rows of photo-imagable material 102a, 102b, 102c, and 102d is removed by wiping off (e.g. "squeegeeing" and the like) the conductive material from the top surface of photoresist structures 102a, 102b, 102c, and 102d. In so doing, the present embodiment insures that layer of conductive material 104 is at a desired depth between rows of photo-imagable material 102a, 102b, 102c, and 102d. In another embodiment, excess conductive material disposed on top of and/or between rows of photo-imagable material 102a, 102b, 102c, and 102d is removed by mechanically polishing off the excess amounts of the conductive material. Again, such an approach insures that the conductive material is deposited to a desired depth between rows of said photo-imagable material 102a, 102b, 102c, and 102d.

Figure 4:
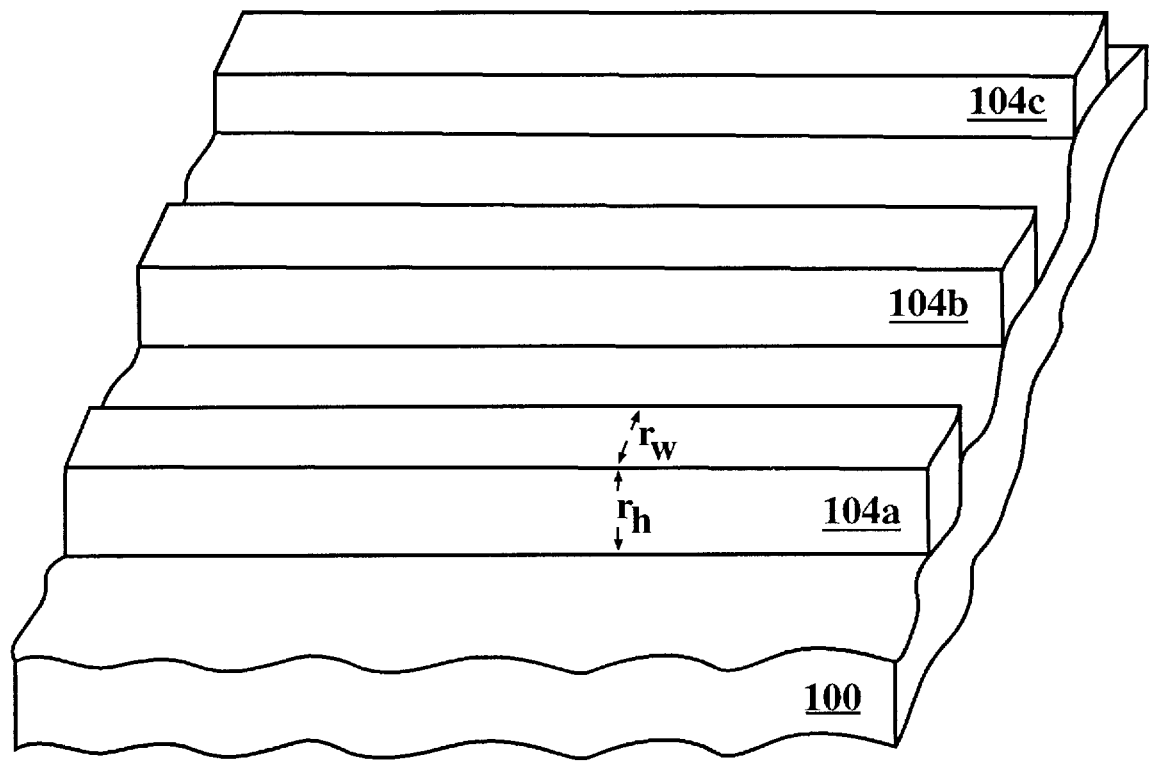
FIG. 4 is a perspective view of the structure of FIG. 3 having the patterned first layer of photo-imagable material removed therefrom in accordance with the present claimed invention.

Referring next to FIG. 4, layer of conductive material 104 is hardened. In the present embodiment, layer of conductive material 104 is baked at approximately 80–90 degrees Celsius for approximately 4–5 minutes. After layer of conductive material 104 is hardened, the present invention removes rows of photo-imagable structures 102a, 102b, 102c, and 102d. In the present embodiment, a technical grade acetone is applied to rows of photo-imagable structures 102a, 102b, 102c, and 102d to remove them from faceplate 100. The present invention is well suited to removing photo-imagable structures 102a, 102b, 102c, and 102d using numerous other solvents such as 400T photoresist stripper of available from Hoechst-Celanese of Somerville, N.J., NMP stripper and the like. As a result, hardened pixel separating structures 104a, 104b, and 104c are formed on faceplate 100. As shown in FIG. 4, in the present embodiment, pixel separating structures 104a, 104b, and 104c are disposed between rows of sub-pixels. Additionally, in the present embodiment, pixel separating structures 104a, 104b, and 104c are formed having a width, $r_w$, of approximately 60–80 microns, and a height, $r_h$, of approximately 10–20 microns. During subsequent processing steps, the sub-pixels of the flat panel display are formed in sub-pixel regions located between rows of pixel separating structures 104a, 104b, and 104c.

Figure 5:
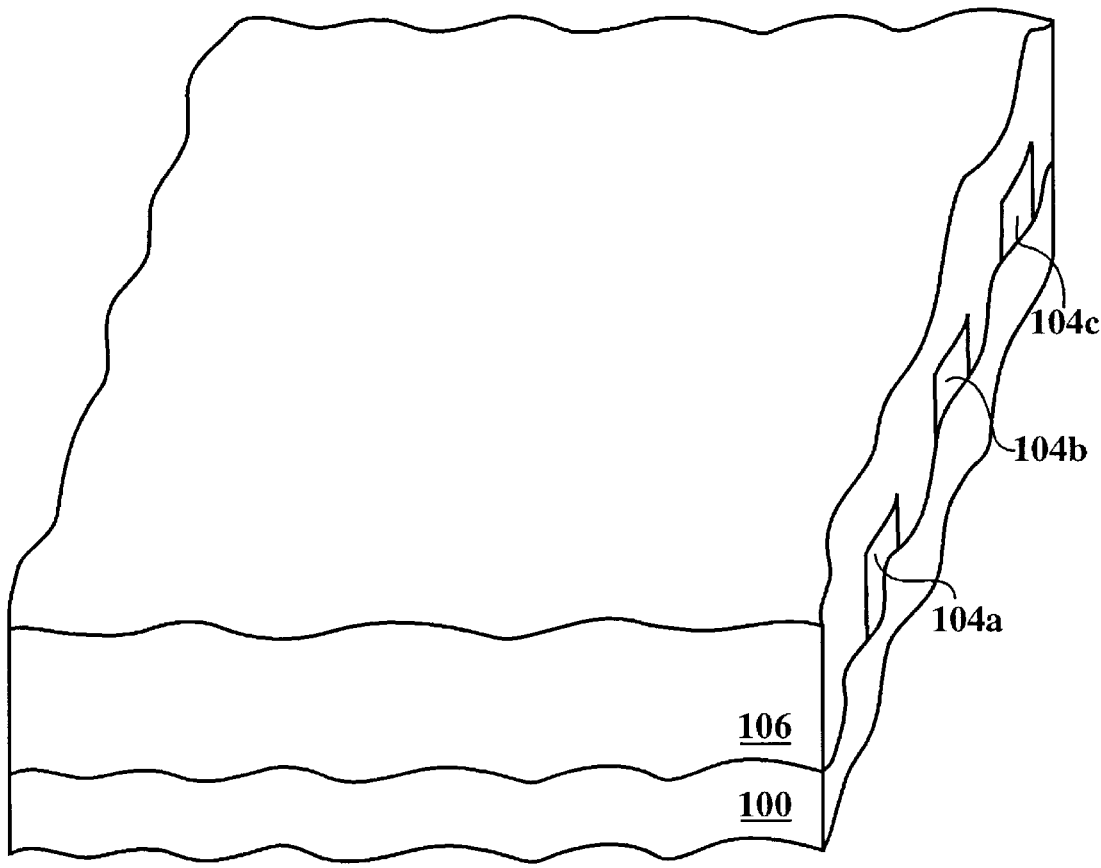
FIG. 5 is a perspective view of the structure of FIG. 4 having a second layer of photo-imagable material deposited thereon in accordance with the present claimed invention.

Referring next to FIG. 5, in the present embodiment, a second layer 106 of photo-imagable material is then applied over faceplate 100 and pixel separating structures 104a, 104b, and 104c. As recited above, in one embodiment, layer of photo-imagable material 106 is comprised of photoresist such as, for example, AZ4620 Photoresist, available from Hoechst-Celanese of Somerville, N.J. Layer of photo-imagable material 106 is deposited to a depth of approximately 40–60 microns in the present embodiment.

Figure 6:
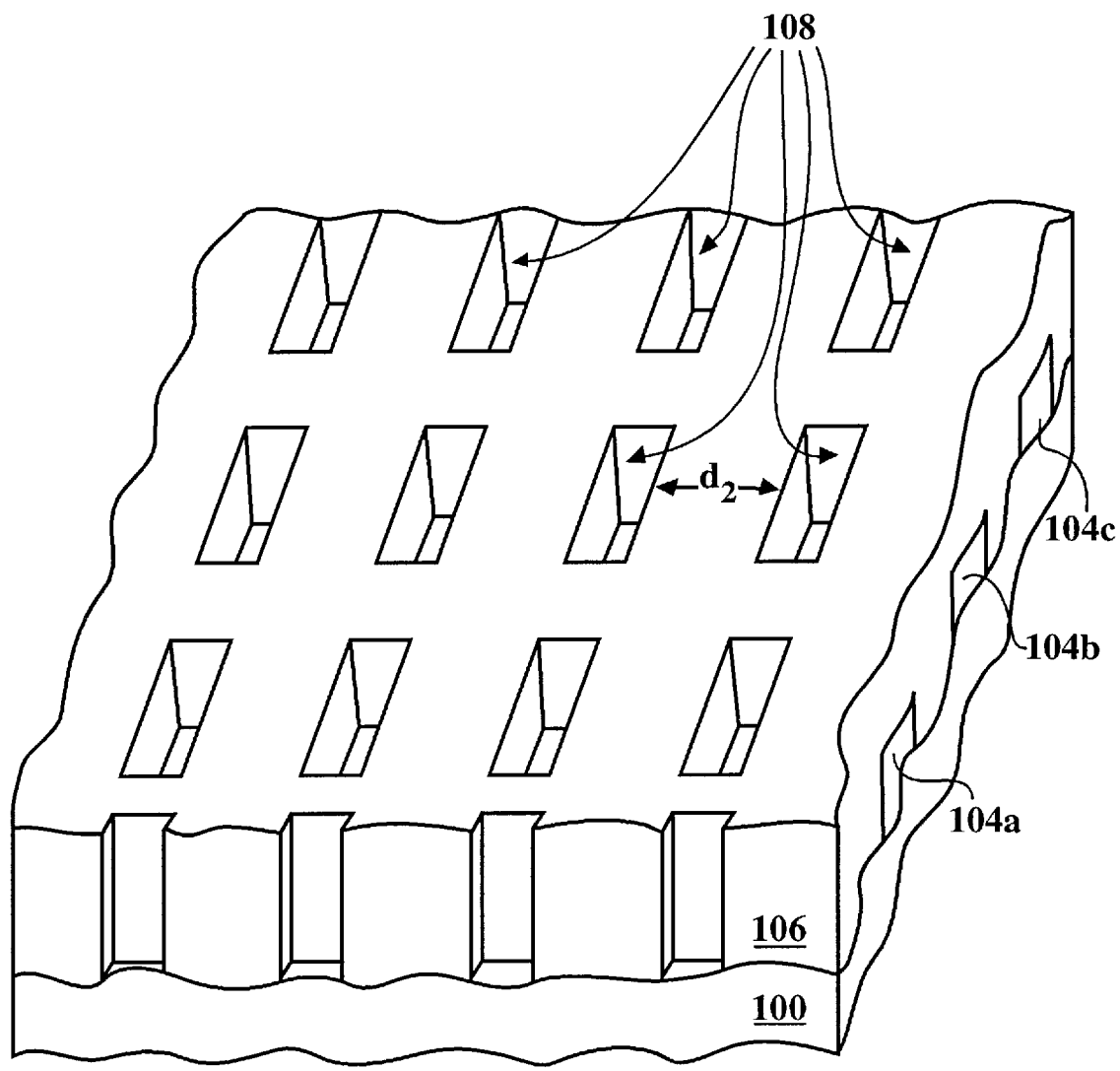
FIG. 6 is a perspective view of the structure of FIG. 5 after patterning of the second layer of photo-imagable material in accordance with the present claimed invention.

With reference next to FIG. 6, after the deposition of layer of photo-imagable material 106, layer of photo-imagable material 106 is subjected to an exposure process. After the exposure process, the present embodiment removes portions of layer of photo-imagable material 106, such that openings, typically shown as 108, are formed in layer of photo-imagable material 106. Openings 108 are formed between respective columns of sub-pixel regions. In this embodiment, adjacent openings are separated from each other by a distance, $d_2$, where $d_2$ is the separation distance between adjacent columns of sub-pixel regions. More specifically, in the present embodiment, adjacent openings in the second layer of photo-imagable material 106 are separated by a distance of approximately 25–30 microns. Although such column separation distances are specified in the present embodiment, the present invention is also well suited to separating adjacent openings by various other distances.

Figure 7:
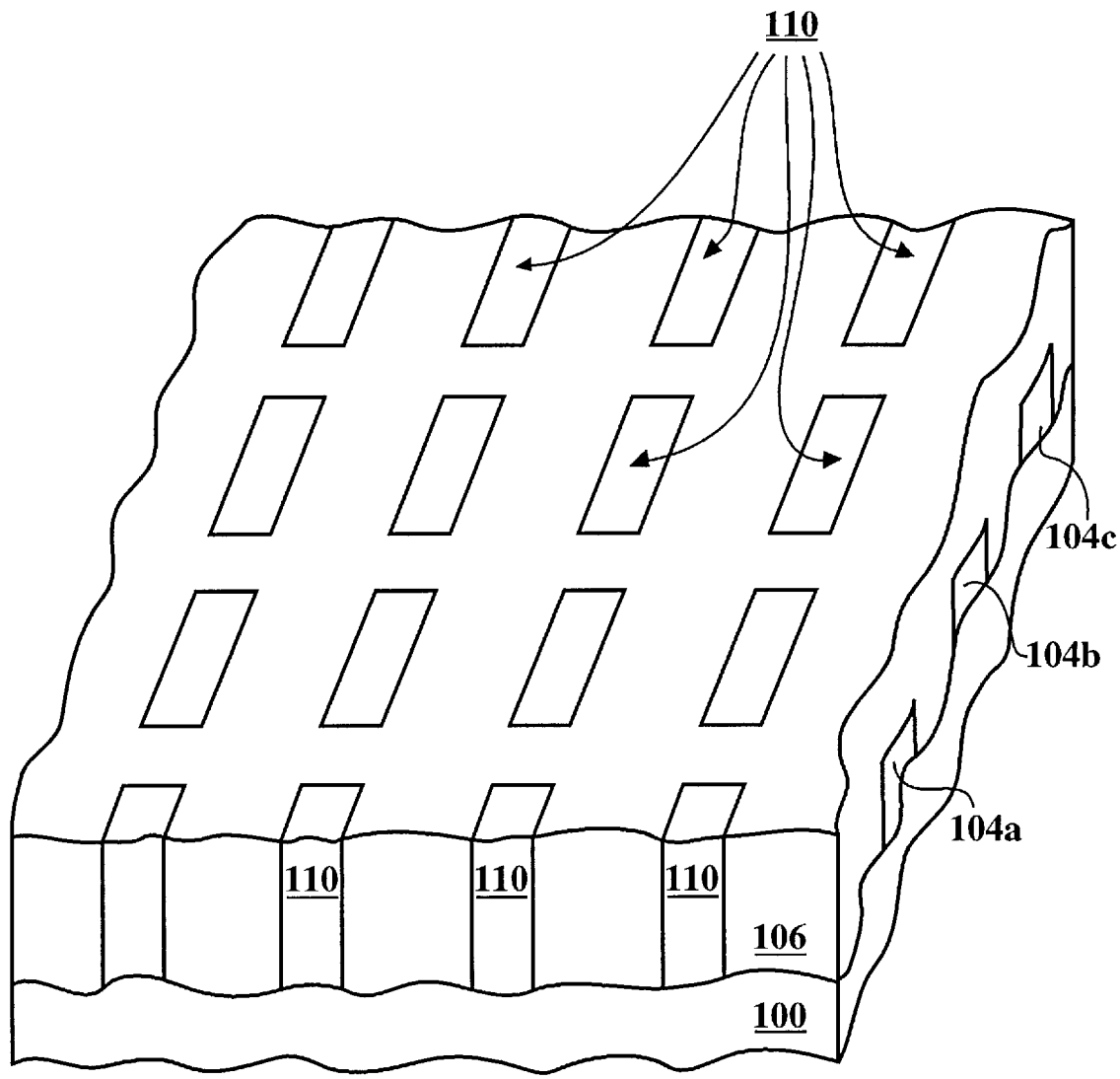
FIG. 7 is a perspective view of the structure of FIG. 6 having a second layer of conductive material disposed thereon in accordance with the present claimed invention.

Referring now to FIG. 7, the present embodiment then applies a layer of conductive material 110 over layer of photo-imagable material 106. More specifically, in one embodiment, the layer of conductive material 110 is applied over the interior surface of faceplate 100 and layer photo-imagable material 106 such that the conductive material is disposed over and in openings 108 formed into layer photo-imagable material 106. As recited above, in the present embodiment, layer of conductive material 110 is comprised, for example, of a CB800A DAG made by Acheson Colloids of Port Huron, Mich. Additionally, in one embodiment, layer of conductive material 110 is comprised of a graphite-based conductive material. In still another embodiment, the layer of graphite-based conductive material is applied as a semi-dry spray to reduce shrinkage of layer of conductive material 110. In so doing, the present invention allows for improved control over the final depth of layer of conductive material 110 in openings 108. Although such deposition methods are recited above, it will be understood that the present invention is also well suited to using various other deposition methods to deposit various other conductive materials over the interior surface of faceplate 100 and into openings 108 in layer photo-imagable material 106.

With reference still to FIG. 7, as mentioned above in conjunction with FIG. 3, the present embodiment is well suited to removing excess amounts of layer of conductive material 110 using, for example, a squeegeeing process, mechanical polishing, and the like. Again, such an approach insures that the conductive material is deposited to a desired depth in openings 108 of layer of photo-imagable material 106.

Figure 8:
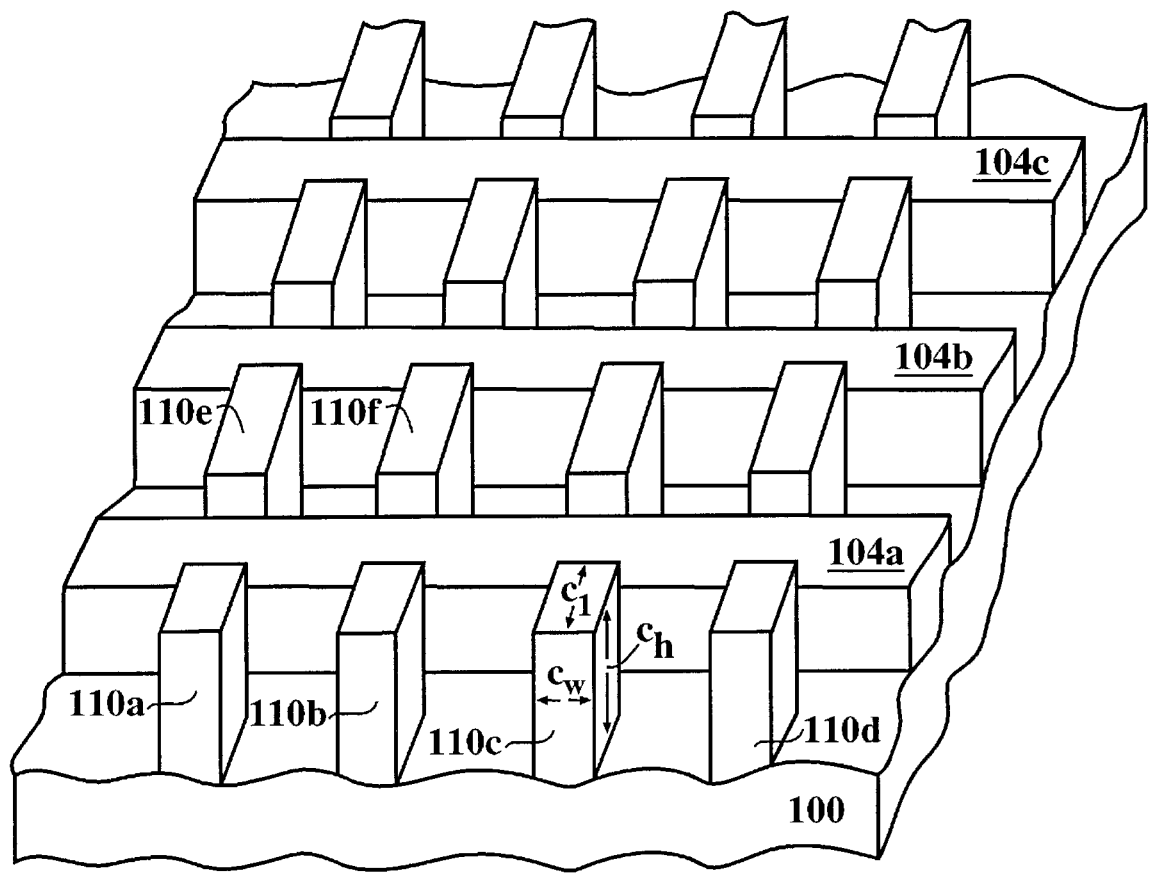
FIG. 8 is a perspective view of the structure of FIG. 7 having the patterned layer second of photo-imagable material removed therefrom thereby leaving behind a multi-level conductive matrix structure in accordance with the present claimed invention.

Referring next to FIG. 8, layer of conductive material 110 is then hardened. In the present embodiment, layer of conductive material 110 is baked at approximately 80–90 degrees Celsius for approximately 4–5 minutes. After layer of conductive material 110 is hardened, the present invention removes layer of photo-imagable material 106. In the present embodiment, a technical grade acetone is applied to layer of photo-imagable material 106 to remove it from faceplate 100. As a result, hardened pixel separating structures, typically shown as 110a–110f are formed on faceplate 100. As shown in FIG. 8, in the present embodiment, pixel separating structures 110a–110f are disposed between columns of sub-pixels and between rows of pixel separating structures 104a, 104b, and 104c. That is, pixel separating structures 110a–110f are formed substantially orthogonally oriented with respect to pixel separating structures 104a, 104b, and 104c. Additionally, in the present embodiment, pixel separating structures 110a–110f are formed having a width, $C_w$, of approximately 20–30 microns, a height, $C_h$, of approximately 40–60 microns, and a length, $C_l$, of approximately 200–220 microns. Thus, the present invention provides a method for forming a multi-level three-dimensional conductive matrix.

The substantial height of the present multi-level three-dimensional conductive matrix effectively isolates neighboring sub-pixels and prevents unwanted back-scattering. The substantial height and conductivity of the present multi-level conductive matrix prevent arcing from the field emitters to the faceplate. By preventing arcing from the field emitters to the faceplate, the present invention increases the high voltage robustness of the flat panel display in which the multi-level three-dimensional conductive matrix is employed. Furthermore, the conductive nature of the multi-level three-dimensional conductive matrix formed by the present invention allows excess charge to be readily removed from the faceplate of the flat panel display. The present invention achieves the above-mentioned accomplishments without requiring the application of an ITO coating.

Figure 9:
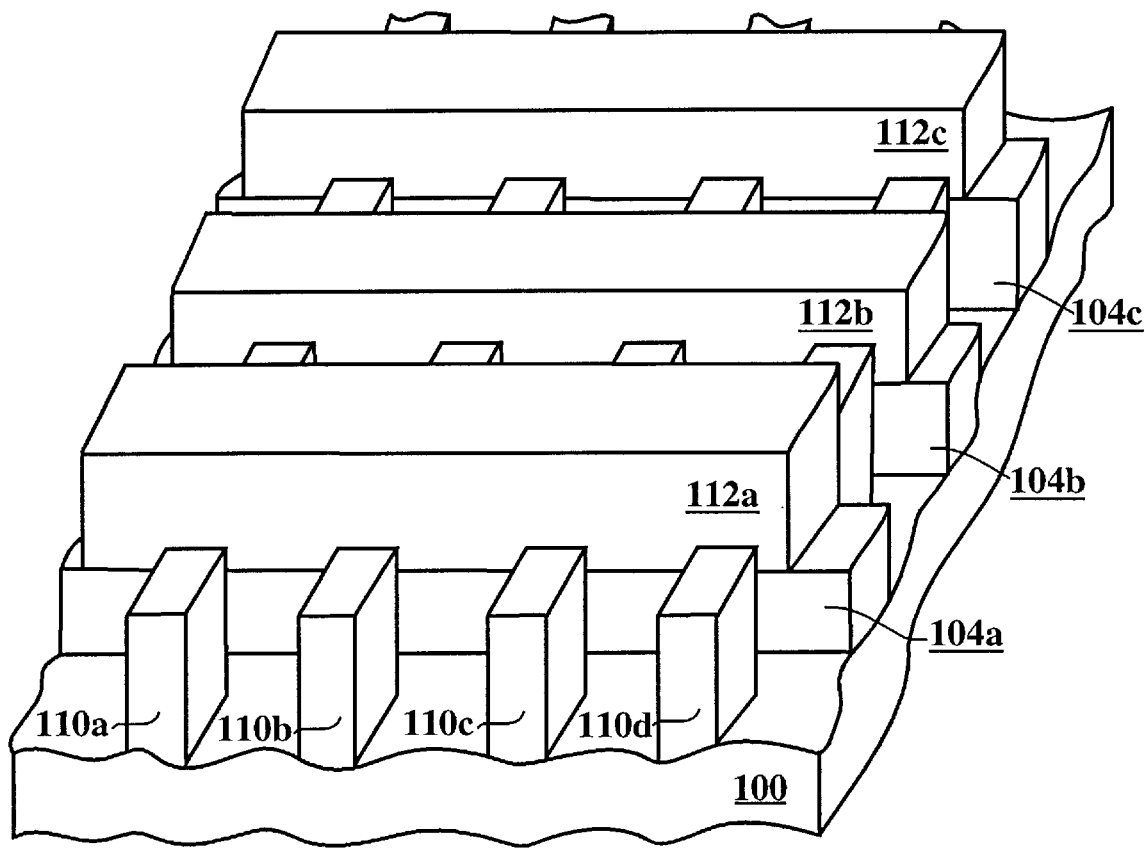
FIG. 9 is a perspective view of the structure of FIG. 8 buttressing a support wall in accordance with the present claimed invention.

Referring next to FIG. 9, in the present invention, the height differential between pixel separating structures 104a, 104b, and 104c, and pixel separating structures 110a–110f is significantly advantageous. Specifically, the taller height of pixel separating structures 110a–110f near the intersection with pixel separating structures 104a, 104b, and 104c provides buttressing for support structures 112a, 112b, and 112c disposed along pixel separating structures 104a, 104b, and 104c. That is, a wall or rib (112a–112c), or another support structure commonly located on row separating portions 104a–104 is stabilized or buttressed by taller proximately located pixel separating structures 110a–110f.

Although the above-described embodiments recite forming rows of pixel separating structures 104a–104c and then forming columns of the pixel separating structures 110a–110f, the present invention is also well suited to forming the columns of pixel separating structures 110a–110f prior to forming the rows of pixel separating structures 104a–104c. Similarly, the present invention is also well suited to forming the pixel separating structures such that the rows of pixel separating structures 104a–104c are taller than the columns of pixel separating structures 110a–110f.

Figure 10:
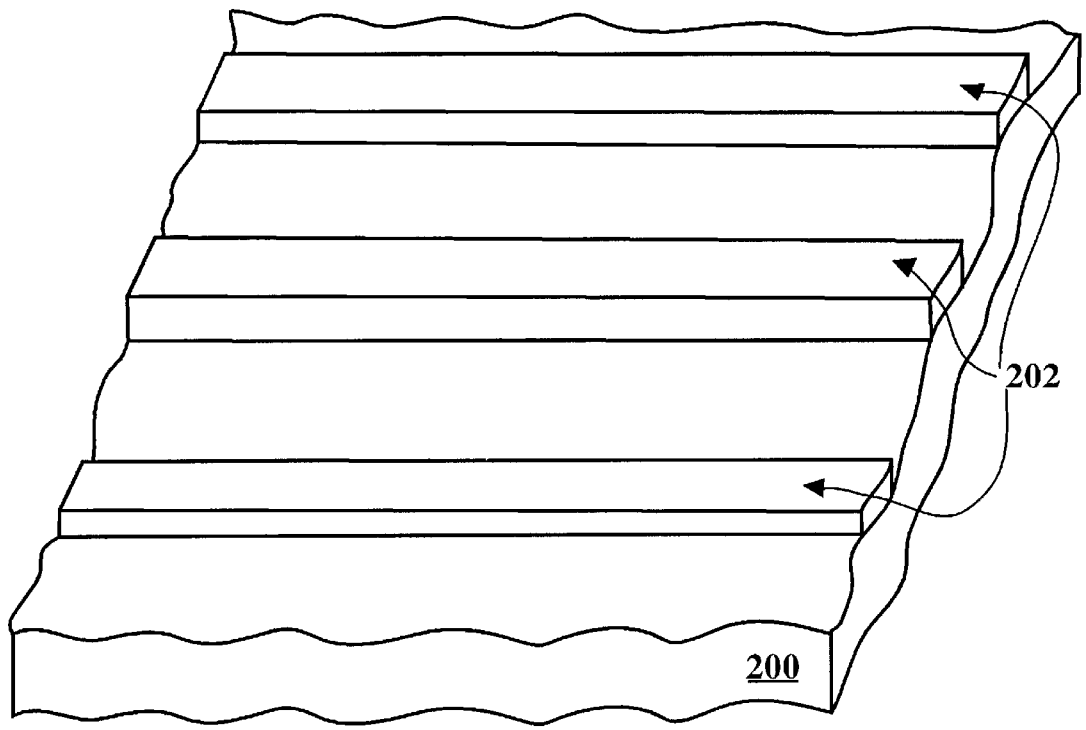
FIG. 10 is a perspective view of a faceplate of a flat panel display device having a first layer of a first pixel separating structure deposited thereon in accordance with the present claimed invention.

With reference next to FIG. 10, another embodiment of the present invention is illustrated. In the embodiment of FIG. 10, a faceplate 200 of a flat panel display device is shown having first portions, typically shown as 202, of respective pixel separating structures deposited thereon. In this embodiment, first portions 202 of the pixel separating structures are comprised of a conductive material such as, for example, CB800A DAG made by Acheson Colloids of Port Huron, Mich., a graphite-based conductive material, and the like. Although such a conductive material is recited in conjunction with this embodiment, the present invention is also well suited to using various other conductive materials. In the present embodiment, first portions 202 of the pixel separating structures are deposited onto faceplate 200 using a screen printing process. That is, the present embodiment does not require the deposition and patterning of a photo-imagable layer as recited in the above-described embodiments.

Figure 11:
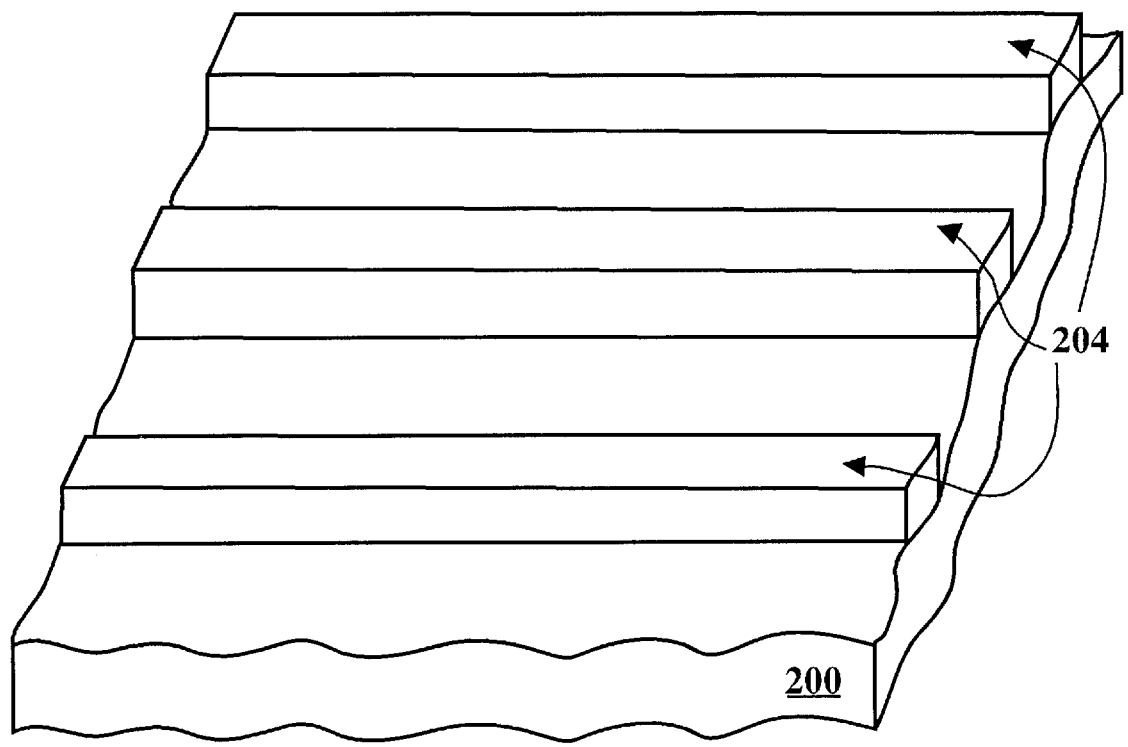
FIG. 11 is a perspective view of the structure of FIG. 10 having a completed first pixel separating structure deposited thereon in accordance with the present claimed invention.

With reference next to FIG. 11, the present embodiment repeatedly applies layers of conductive material over the surface of faceplate 200 until the pixel separating structures, typically shown as 204, are completely formed. In the present embodiment, the conductive material is repeatedly applied to the surface of faceplate 200 until pixel separating structures 204 have a height of approximately 10–15 microns. Additionally, in this embodiment, pixel separating structures 204 are formed on the surface of faceplate 200 such that pixel separating structures 204 separate rows of sub-pixel regions.

Figure 12:
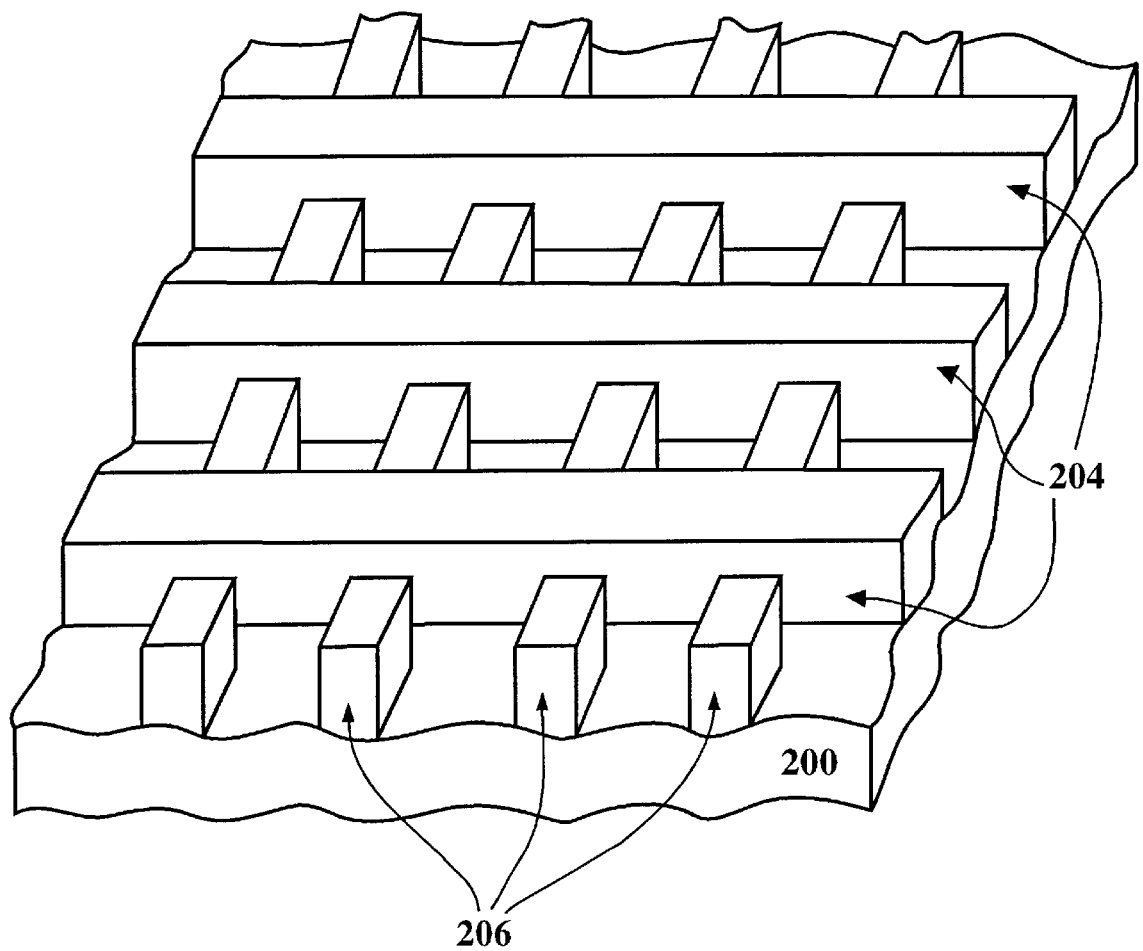
FIG. 12 is a perspective view of a faceplate the structure of FIG. 11 having a first layer of a second pixel separating structure deposited thereon in accordance with the present claimed invention.

Referring now to FIG. 12, after the deposition of pixel separating structures 204, the present embodiment deposits first portions, typically shown as 206, of pixel separating structures onto the surface of faceplate 200. Again, first portions 206 of the pixel separating structures are comprised of a conductive material such as, for example, CB800A DAG made by Acheson Colloids of Port Huron, Mich., a graphite-based conductive material, and the like.

Figure 13:
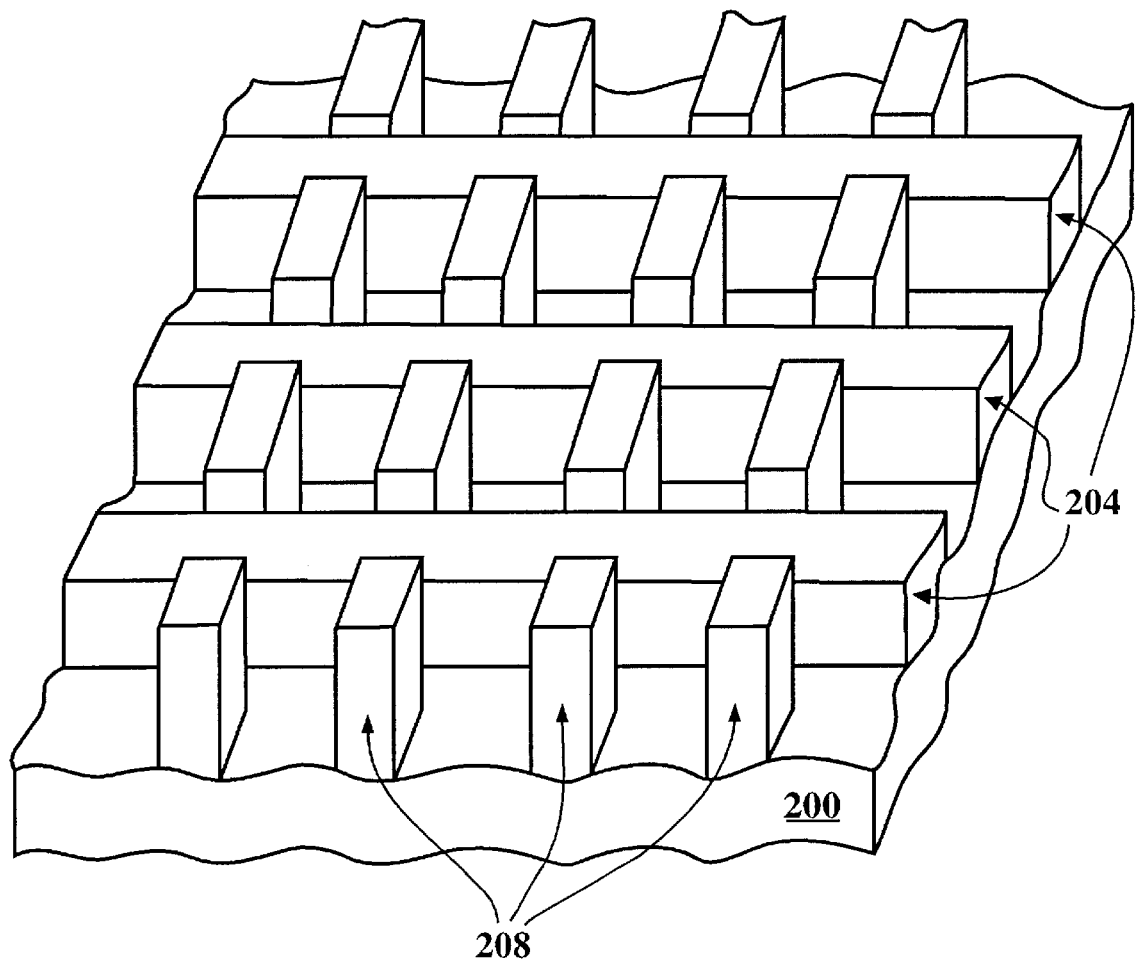
FIG. 13 is a perspective view of the structure of FIG. 12 having a completed second pixel separating structure deposited thereon, thereby forming a multi-level conductive matrix structure in accordance with the present claimed invention.

Referring now to FIG. 13, the present embodiment repeatedly applies layers of the conductive material over the surface of faceplate 200 until the pixel separating structures, typically shown as 208, are completely formed. In the present embodiment, the conductive material is repeatedly applied to the surface of faceplate 200 until pixel separating structures 208 have a height of approximately 30–60 microns. Additionally, in this embodiment, pixel separating structures 208 are formed on the surface of faceplate 200 such that pixel separating structures 208 are substantially orthogonally oriented with respect to pixel separating structures 204, and such that pixel separating structures 208 separate columns of sub-pixel regions. As mentioned above, the present embodiment provides a method for the formation of a multi-level three-dimensional conductive matrix wherein the method does not require the deposition and patterning of a layer of photo-imagable material. Furthermore, although the above-described embodiment recites forming rows of pixel separating structures 204 and then forming columns of the pixel separating structures 208, the present invention is also well suited to forming the columns of pixel separating structures 208 prior to forming the rows of pixel separating structures 204. Similarly, the present invention is also well suited to forming the pixel separating structures such that the rows of pixel separating structures 204 are taller than the columns of pixel separating structures 208.

The above-described embodiments of the present invention have several substantial benefits associated therewith. For example, by using the aforementioned graphite-based conductive material to form the pixel separating structures, the present invention eliminates deleterious browning and outgassing associated with prior art polyimide based black matrix structures. Additionally, the conductive material utilized in the present invention can be subjected, without damage thereto, to higher processing temperatures than can be used when the matrix structure is formed of polyimide. Thus, the present invention provides for more a complete removal of the organics which remain as a by-product of phosphor screening processes.

Thus, the present invention provides a conductive matrix structure having sufficient height to effectively separate neighboring sub-pixels. The present invention further provides a conductive matrix structure which reduces arcing from the field emitters to the sub-pixels. The present invention also provides a conductive matrix structure which does not have the increased cost and complexity, the increased electron back-scattering rate, and the undesirably high secondary electron emission coefficient associated with an ITO coated black matrix structure. Furthermore, the present invention provides a conductive matrix formation method which is not highly dependent upon the physical properties of the material used to form the matrix structure.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications suited to the particular use contemplated. It is intended that the scope of the invention be defined by the Claims appended hereto and their equivalents.

We claim:

1. A method for forming a multi-level conductive matrix structure for separating rows and columns of sub-pixels on a faceplate of a flat panel display device, said method comprising the steps of:

a) applying a first layer of photo-imagable material across said faceplate;

b) removing portions of said first layer of photo-imagable material such that rows of said first layer of photo-imagable material are disposed covering respective rows of sub-pixel regions;

c) applying a first layer of conductive material over said faceplate such that said first layer conductive material is disposed between said rows of said first layer of photo-imagable material;

d) removing said rows of said first layer of photo-imagable material such that rows of said first layer of conductive material are formed above said faceplate between said rows of sub-pixel regions;

e) applying a second layer of photo-imagable material across said faceplate;

f) removing portions of said second layer of photo-imagable material such that openings are formed in said second layer of photo-imagable material, said openings disposed between respective columns of said sub-pixel regions;

g) applying a second layer of conductive material over said faceplate such that said second layer of conductive material is disposed in said openings in said second layer of photo-imagable material; and h) removing said second layer of photo-imagable material such that columns of said second layer of conductive material are formed above said faceplate between said columns of sub-pixel regions and between said rows of said first layer of conductive material.

2. The method for forming a multi-level conductive matrix structure as recited in claim 1 wherein step a) comprises applying a first layer of photoresist across said faceplate.

3. The method for forming a multi-level conductive matrix structure as recited in claim 1 wherein step a) comprises applying said photo-imagable material to a depth of approximately 10–20 microns.

4. The method for forming a multi-level conductive matrix structure as recited in claim 1 wherein step c) comprises applying a first layer of a graphite-based conductive material over said faceplate.

5. The method for forming a multi-level conductive matrix structure as recited in claim 1 wherein step c) further includes the step of:

c1) removing excess amounts of said first layer of conductive material such that said first layer of conductive material is at a desired depth between said rows of said photo-imagable material.

6. The method for forming a multi-level conductive matrix structure as recited in claim 5 wherein step c1) comprises wiping off said excess amounts of said first layer conductive material such that said first layer of conductive material is at a desired depth between said rows of said photo-imagable material.

7. The method for forming a multi-level conductive matrix structure as recited in claim 5 wherein step c1) comprises mechanically polishing off said excess amounts of said first layer conductive material such that said first layer of conductive material is deposited to a desired depth between said rows of said photo-imagable material.

8. The method for forming a multi-level conductive matrix structure as recited in claim 1 wherein step d) comprises removing said rows of said first layer of photo-imagable material using a solvent.

9. The method for forming a multi-level conductive matrix structure as recited in claim 1 wherein step e) comprises applying a second layer of photoresist across said faceplate.

10. The method for forming a multi-level conductive matrix structure as recited in claim 1 wherein step e) comprises applying said photo-imagable material to a depth of approximately 40–60 microns.

11. The method for forming a multi-level conductive matrix structure as recited in claim 1 wherein step g) comprises applying a second layer of a graphite-based conductive material over said faceplate.

12. The method for forming a multi-level conductive matrix structure as recited in claim 1 wherein step g) further includes the step of:

g1) removing excess amounts of said second layer of conductive material such that said second layer conductive material is at a desired depth in said openings in said second layer of photo-imagable material.

13. The method for forming a multi-level conductive matrix structure as recited in claim 12 wherein step g1) comprises wiping off said excess amounts of said second layer of conductive material such that said second layer of conductive material is at a desired depth in said openings in said second layer of photo-imagable material.

14. The method for forming a multi-level conductive matrix structure as recited in claim 12 wherein step g1) comprises mechanically polishing off said excess amounts of said second layer of conductive material such that said second layer of conductive material is at a desired depth in said openings in said second layer of photo-imagable material.

15. The method for forming a multi-level conductive matrix structure as recited in claim 1 wherein step h) comprises removing said second layer of photo-imagable material using a solvent.

16. A method for forming a three-dimensional multi-level conductive matrix structure for a flat panel display device, said method comprising the steps of:
   a) forming first pixel separating structures across a surface of a faceplate of said flat panel display device to separate first sub-pixel regions; step a) further comprising the steps of:
      a1) applying a first layer of photo-imagable material across said surface of said faceplate;
      a2) after an exposure process, removing portions of said first layer of photo-imagable material such that regions of said first layer of photo-imagable material are disposed covering respective said first sub-pixel regions;
      a3) applying a first layer of conductive material over said surface of said faceplate such that said first layer conductive material is disposed between said regions of said first layer of photo-imagable material;
      a4) removing said regions of said first layer of photo-imagable material such that said first pixel separating structures are formed of said first layer of conductive material and such that said first pixel separating structures are disposed between said first sub-pixel regions; and
   b) forming second pixel separating structures across said surface of said faceplate of said flat panel display device to separate second sub-pixel regions; step b) further comprising the steps of:
      b1) applying a second layer of photo-imagable material across said surface of said faceplate;
      b2) after an exposure process, removing portions of said second layer of photo-imagable material such that openings are formed in said second layer photo-imagable material between respective said second sub-pixel regions;
      b3) applying a second layer of conductive material over said surface of said faceplate such that said second layer of conductive material is disposed in said openings in said second layer of photo-imagable material; and
      b4) removing said second layer of photo-imagable material such that said second pixel separating structures are formed of said second layer of conductive material and such that said second pixel separating structures are disposed between said second sub-pixel regions and between said first pixel separating structures.

17. The method for forming a three-dimensional multi-level conductive matrix structure as recited in claim 16 wherein said first sub-pixel regions are rows of said sub-pixel regions.

18. The method for forming a three-dimensional multi-level conductive matrix structure as recited in claim 16 wherein said second sub-pixel regions are columns of said sub-pixel regions.

19. The method for forming a three-dimensional multi-level conductive matrix structure as recited in claim 16 wherein said first pixel separating structures are formed having a height of approximately 10–15 microns.

20. The method for forming a three-dimensional multi-level conductive matrix structure as recited in claim 16 wherein said second pixel separating structures are formed having a height of approximately 30–60 microns.

21. The method for forming a three-dimensional multi-level conductive matrix structure as recited in claim 16 wherein said first layer of conductive material is applied as a semi-dry spray to reduce shrinkage of said first layer of conductive material.

22. The method for forming a three-dimensional multi-level conductive matrix structure as recited in claim 16 wherein said second layer of conductive material is applied as a semi-dry spray to reduce shrinkage of said second layer of conductive material.

23. The method for forming a three-dimensional multi-level conductive matrix structure as recited in claim 16 wherein said first layer of conductive material is comprised of a graphite-based material.

24. The method for forming a three-dimensional multi-level conductive matrix structure as recited in claim 16 wherein said second layer of conductive material is comprised of a graphite-based material.

25. The method for forming a three-dimensional multi-level conductive matrix structure as recited in claim 16 wherein step a3) further includes the step of:
   removing excess amounts of said first layer of conductive material such that said first layer conductive material is at a desired depth between said regions of said first layer of photo-imagable material.

26. The method for forming a three-dimensional multi-level conductive matrix structure as recited in claim 25 wherein step a3) further comprises wiping off said excess amounts of said first layer of conductive material such that said first layer of conductive material is at a desired depth between said regions of said first layer of photo-imagable material.

27. The method for forming a three-dimensional multi-level conductive matrix structure as recited in claim 25 wherein step a3) further comprises mechanically polishing off said excess amounts of said first layer of conductive material such that said first layer of conductive material is at a desired depth between said regions of said first layer of photo-imagable material.

28. The method for forming a three-dimensional multi-level conductive matrix structure as recited in claim 16 wherein step b3) further includes the step of:
   removing excess amounts of said second layer of conductive material such that said second layer conductive material is at a desired depth in said openings in said second layer of photo-imagable material.

29. The method for forming a three-dimensional multi-level conductive matrix structure as recited in claim 28 wherein step b3) further comprises wiping off said excess amounts of said second layer of conductive material such that said second layer of conductive material is at a desired depth in said openings in said second layer of photo-imagable material.

30. The method for forming a three-dimensional multi-level conductive matrix structure as recited in claim 28 wherein step b3) further comprises mechanically polishing off said excess amounts of said second layer of conductive material such that said second layer of conductive material is at a desired depth in said openings in said second layer of photo-imagable material.

31. A method for forming a multi-level conductive matrix structure for separating rows and columns of sub-pixels on a faceplate of a flat panel display device, said method comprising the steps of:

a) depositing a first pixel separating structure onto a surface of said faceplate, said first pixel separating structure disposed on said surface of said faceplate such that said first pixel separating structure separates first sub-pixel regions; and b) depositing a second pixel separating structure onto said surface of said faceplate, said second pixel separating structure disposed on said surface of said faceplate such that said second pixel separating structure is orthogonally oriented with respect to said first pixel separating structure, and such that said second pixel separating structure separates second sub-pixel regions.

32. The method for forming a multi-level conductive matrix structure as recited in claim 31 wherein said first sub-pixel regions are rows of said sub-pixel regions.

33. The method for forming a multi-level conductive matrix structure as recited in claim 31 wherein said second sub-pixel regions are columns of said sub-pixel regions.

34. The method for forming a multi-level conductive matrix structure as recited in claim 31 wherein said first pixel separating structure is formed having a height of approximately 10–15 microns.

35. The method for forming a multi-level conductive matrix structure as recited in claim 31 wherein said second pixel separating structure is formed having a height of approximately 30–60 microns.

36. The method for forming a multi-level conductive matrix structure as recited in claim 31 wherein said first pixel separating structure is comprised of a graphite-based material.

37. The method for forming a multi-level conductive matrix structure as recited in claim 31 wherein said second pixel separating structure is comprised of a graphite-based material.

38. The method for forming a multi-level conductive matrix structure as recited in claim 31 wherein step a) comprises repeatedly applying layers of conductive material over said surface of said faceplate until said first pixel separating structure is formed having a desired height between said first sub-pixel regions.

39. The method for forming a multi-level conductive matrix structure as recited in claim 31 wherein step b) comprises repeatedly applying layers of conductive material over said surface of said faceplate until said second pixel separating structure is formed having a desired height between said second sub-pixel regions.

* * * * *